United States Patent [19]
Williams

[11] Patent Number: 4,542,335
[45] Date of Patent: Sep. 17, 1985

[54] ELECTRONIC CONTROL CIRCUIT SYSTEMS ANALYZER

[75] Inventor: Richard L. Williams, Jacksonville, Fla.

[73] Assignee: Miller Special Tools, Division of Triangle Corporation, Garden City, Mich.

[21] Appl. No.: 466,669

[22] Filed: Feb. 15, 1983

[51] Int. Cl.$^4$ ............................................. G01R 31/02
[52] U.S. Cl. ........................................ 324/66; 324/52
[58] Field of Search ................... 324/51, 52, 66, 73 R; 179/175.3 F; 340/650, 651, 652

[56] References Cited

U.S. PATENT DOCUMENTS

| | | | |
|---|---|---|---|
| 3,982,180 | 9/1976 | Vaiden | 324/66 X |
| 4,257,002 | 3/1981 | Helms | 324/66 |
| 4,298,969 | 11/1981 | Rickenbacker | 179/175.3 F X |
| 4,399,400 | 8/1983 | Rockwell | 324/66 X |

FOREIGN PATENT DOCUMENTS

0739439  6/1980  U.S.S.R. ................................. 324/66

OTHER PUBLICATIONS

Wall Chart T 3/2 U.S.A., 1980, Robert Bosch.

*Primary Examiner*—Stanley T. Krawczewicz
*Assistant Examiner*—Jose M. Solis
*Attorney, Agent, or Firm*—Harness, Dickey & Pierce

[57] ABSTRACT

An electronic fuel injection system tester performs a plurality of system integrity tests on individual components and sensors of the system. The tester is plug compatible with the various wiring harness and connectors of the fuel injection system to permit a plurality of integrity tests to be performed either simultaneously or in rapid succession. The tester may be used to test a wide variety of fuel injection systems found in many popular vehicles by virtue of a multiple purpose electronic circuit and front panel template overlays corresponding to each make of vehicle or type of fuel injection system.

11 Claims, 5 Drawing Figures

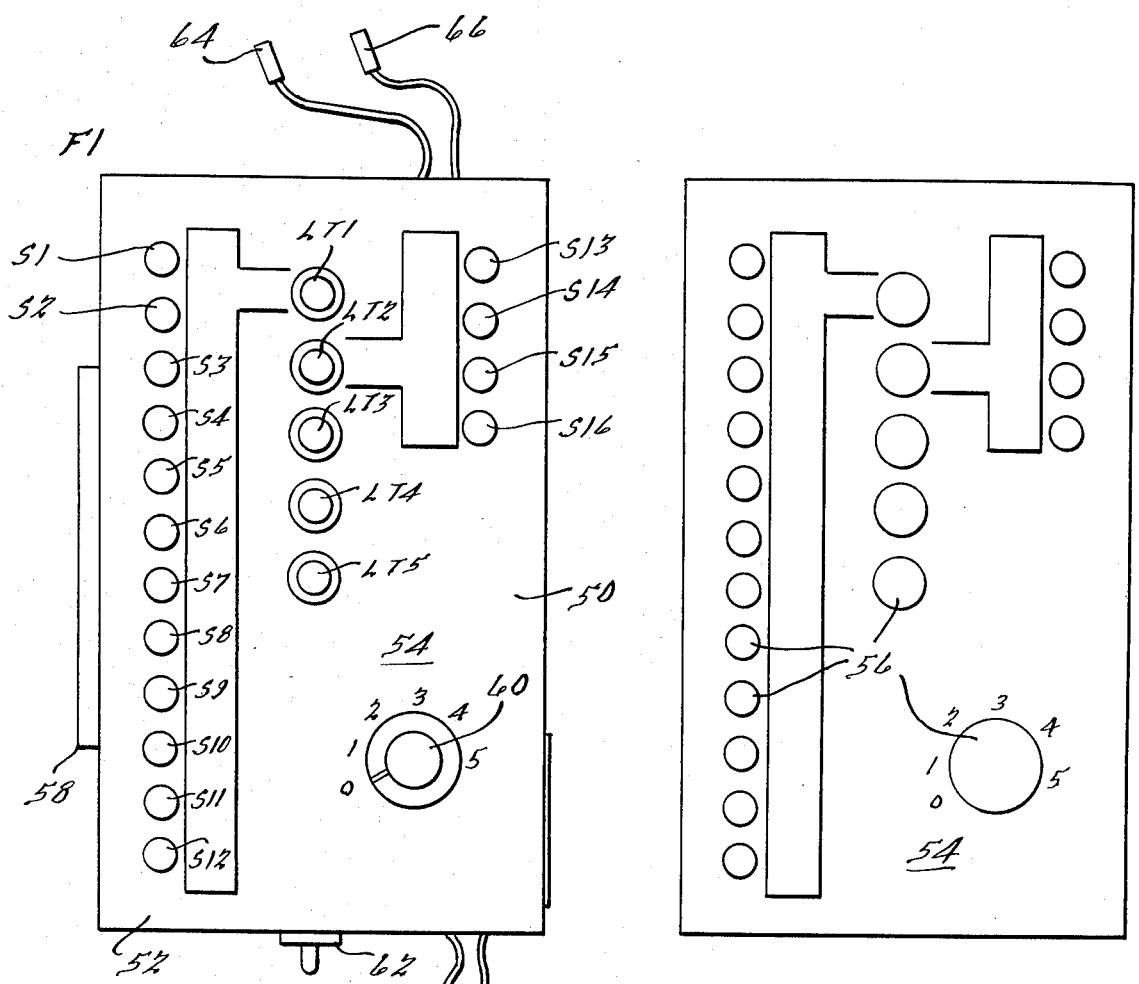
Fig. 3.
Fig. 4.
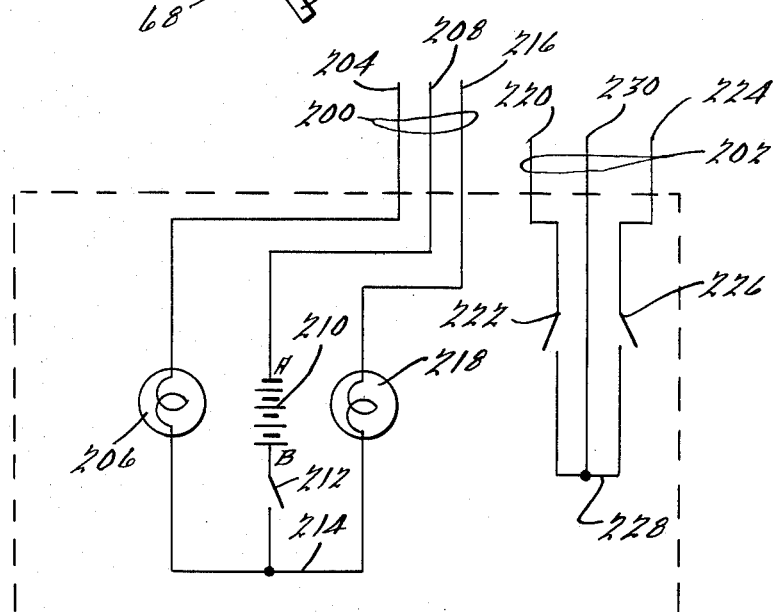
Fig. 5.

ELECTRONIC CONTROL CIRCUIT SYSTEMS ANALYZER

BACKGROUND OF THE INVENTION

1. Field of the Invention

This invention relates generally to automotive testing equipment, and more particularly to a device for testing the integrity of an electronic fuel injection system.

2. Description of the Prior Art

Automotive control systems utilizing electronic components and sensors have increased dramatically in complexity with the advent of microelectronics. Systems such as the fuel injection system now employ a multiplicity of electrically responsive components and sensors which communicate through one or more wiring harnesses to a central control unit. The central control unit responds to various temperature, pressure, fuel mixture, exhaust emission and engine timing signals (to name a few) to control fuel injection valve opening time for optimal performance under the existing conditions.

When the fuel injection system fails it is often very difficult to identify which component(s) or sensor(s) are at fault. Testing each individual component or sensor, one at a time, is time consuming and expensive. Furthermore, during assembly of an automotive vehicle and thereafter during routine maintenance, it would be highly desirable to test the integrity of each of the individual components which make up the fuel injection system using a single tester. Ideally a tester for this purpose should be inexpensive, highly reliable, as well as quick and easy to use and capable of performing all necessary tests either substantially simultaneously or in rapid succession. Prior art devices have been generally deficient in this regard.

While there is a certain trend toward standardizing the components and sensors which make up a fuel injection system, the wide variety of design approaches taken up by the various manufacturers of automotive vehicles and automotive products worldwide has rendered this trend less than perfect. Even using standard components, fuel injection systems may be configured in a variety of different ways which has heretofore thwarted efforts towards providing a universal electronic fuel injection system tester. Thus there remains a need for such a universal tester.

SUMMARY OF THE INVENTION

Towards the end of providing an economical, reliable fuel injection system tester that is easy to use and is readily adaptible for testing a variety of fuel injection system designs, the present invention comprises the following. A connector having a plurality of electrical terminals is adapted for coupling to the wiring harness of the vehicle fuel injection system. A plurality of individual circuits for testing the integrity of the individual components of the fuel ignition system are coupled to the connector and preferably housed in a common enclosure having a front panel. The invention comprises first and second circuits for testing the integrity of the fuel injection system, although frequently a greater number of individual circuits may be provided. Each testing circuit includes a switching means, such as an automated stepping circuit or manual push button switch, coupled to the testing circuit for enabling the circuit to perform an integrity test. The invention further comprises a plurality of indicators which are responsive to the testing circuits for indicating the integrity of the electrically responsive component being tested. In the presently preferred embodiment the testing circuits are capable of performing a multiplity of functions, thus making the invention useful for testing a wide variety of fuel injection systems. Towards this end the front panel of the tester is adapted for use with replaceable templates which overlay the manual switches and indicators to provide the appropriate labels and instructions for using the invention with a given type of fuel injection system.

Other objects, features, and advantages of the present invention will become apparent from the subsequent description and the appended claims, taken in conjunction with the accompanying drawings.

BRIEF DESCRIPTION OF THE DRAWINGS

FIG. 3 is a top plan view of the invention;

FIG. 4 illustrates a removable template used in conjunction with the present invention; and FIG. 5 is a schematic block diagram of the throttle switch testing apparatus of the present invention.

DESCRIPTION OF THE PREFERRED EMBODIMENT

Figure 1:
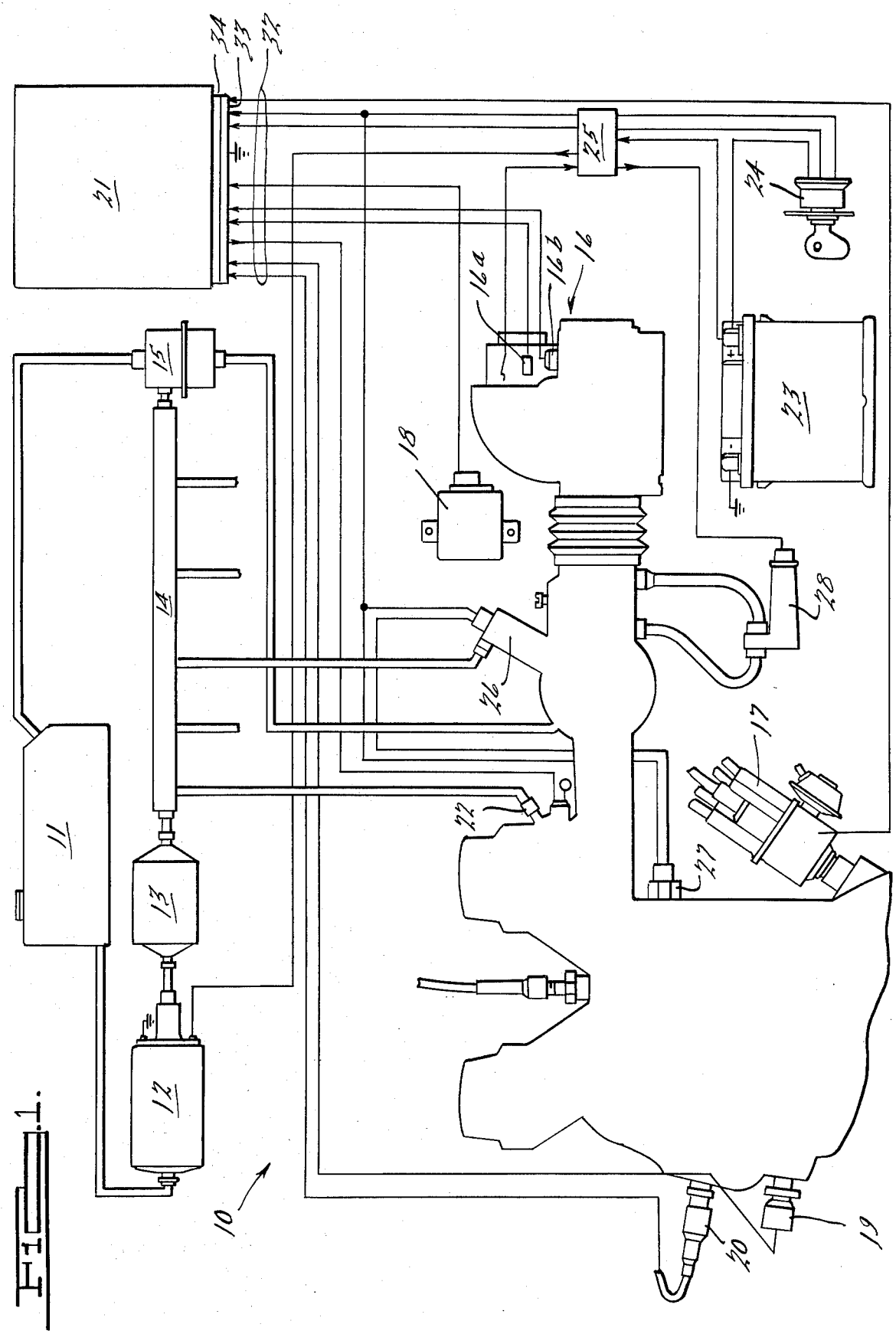
FIG. 1 is a schematic block diagram illustrating a typical electronic fuel injection system employing a plurality of individual components and sensors, the integrity of which may be tested by the present invention.

With reference to FIG. 1, the electrical control system of a typical fuel injection system is illustrated. In particular, the system illustrated is a typical embodiment of electronic fuel injection system known as the L-Jetronic fuel-injection system manufactured by Robert Bosch. It is to be understood that the particular fuel injection system configuration illustrated in FIG. 1 is selected only for purposes of describing the present invention and is not to be construed as a limitation thereof. Generally those skilled in the art will recognize that the invention is equally usable with other fuel injection systems. The fuel injection system 10 comprises fuel tank 11 and fuel pump 12 for delivering fuel from tank 11 and providing system pressure. Fuel is delivered through fuel filter 13 to fuel rail 14 which distributes the fuel evenly to all injection valves. A pressure regulator 15 controls the system pressure in relation to intake manifold, and an air flow meter 16 measures intake air flow by means of potentiometer 16a and intake air temperature by means of sensor 16b and sends a signal to the electronic control unit 21. Ignition distributor 17 provides a signal indicative of engine speed and timing to control unit 21, while throttle valve switch 18 signals idle and full load throttle positions to control unit 21. A temperature sensor 19 provides a signal indicative of engine temperature to control unit 21, and lambda sensor 20 provides a signal indicative of the exhaust gas composition to control unit 21. Control unit 21 receives input signals from the various sensors described and provides control signals for controlling the injection valves. Preferably control unit 21 is coupled to the various sensors and components via a wiring harness 32 having terminal connector 33 for coupling to a corresponding connector 34 on the electronic control unit 21. Injection valve 22 receives signals from control unit 21 and injects and atomizes fuel in front of the intake valve in response to a signal from control unit 21. Electrical power for the electronic fuel injection system is provided by means of conventional battery 23 ignition and starting switch 24 and relay set 25 which controls power supplied to the fuel pump 12 and control unit 21. A cold start valve 26 injects extra fuel into the intake manifold for starting when the engine is cold. Operation of the control start valve 26 is accomplished by turning the ignition switch 24 to the start position. Current then goes from the ignition switch 24 to and through relay 25 to the cold start 26, through its electrical winding to the thermo-time switch 27. If the engine temperature is below a predetermined temperature (about 57 degrees) the thermo-time switch 27 will provide an electrical ground for the cold start valve 26. As soon as the engine starts, the operator of the vehicle then releases the ignition switch 24 to the engine run position. The cold start valves 26 power signal is then cut, it closed and fuel is no longer injected. The thermo-time switch 27 may still be cold enough to provide electrical ground. An auxiliary air valve 28 supplies extra air to the engine for higher idle speed during warmup as determined by air flow meter 16.

The tester of the present invention comprises a case or housing 50, as shown in FIG. 3, having front panel 52 including a template 54 which is replaceably overlaid on front panel 52 to provide labels and operating instructions. Template 54 is shown in greater detail in FIG. 4, and it will be appreciated that the invention may be supplied with one or more of such templates, each corresponding to a different make or model of automotive vehicle or to a different type of fuel injection system. The templates 54 are provided with a plurality of cut-outs 56 positioned to register with various buttons, switches and indicators displayed on the front panel 52 of the tester.

Housing 50 is also provided with a wiring harness connector 58 which may preferably be a multiple pin connector assembly of the type used to input and output signals to and from control unit 21. In other words, connector 58 is preferably plug compatible with wiring harness 32. The front panel 52 of housing 50 has a plurality of push button switches S1-S12 which, in the presently preferred embodiment, are vertically arranged along the left side of front panel 52. An additional plurality of switches S13-S15 are vertically arranged along the upper right corner of front panel 52, while a plurality of indicators, for example lights or light emitting diodes, LT1-LT5 are vertically arranged midway between the plurality of switches S1-S12 and the plurality of switches S13-16. Front panel 52 further includes a rotary switch 60 of the type capable of selecting among a plurality of circuits by rotation to a plurality of discrete positions. The invention also includes an analyzer test switch 62 disposed on housing 50 whose function is to initiate an integrity test of the invention itself. The invention further includes power supply leads 64 and 66 for connecting to the positive and negative terminals, respectively, of a source of DC power such as to the battery of the vehicle being tested. Ohmmeter leads 68 and 70 are also provided to couple the invention to a conventional ohmmeter (not shown) during the performance of certain tests yet to be described.

Figure 2:
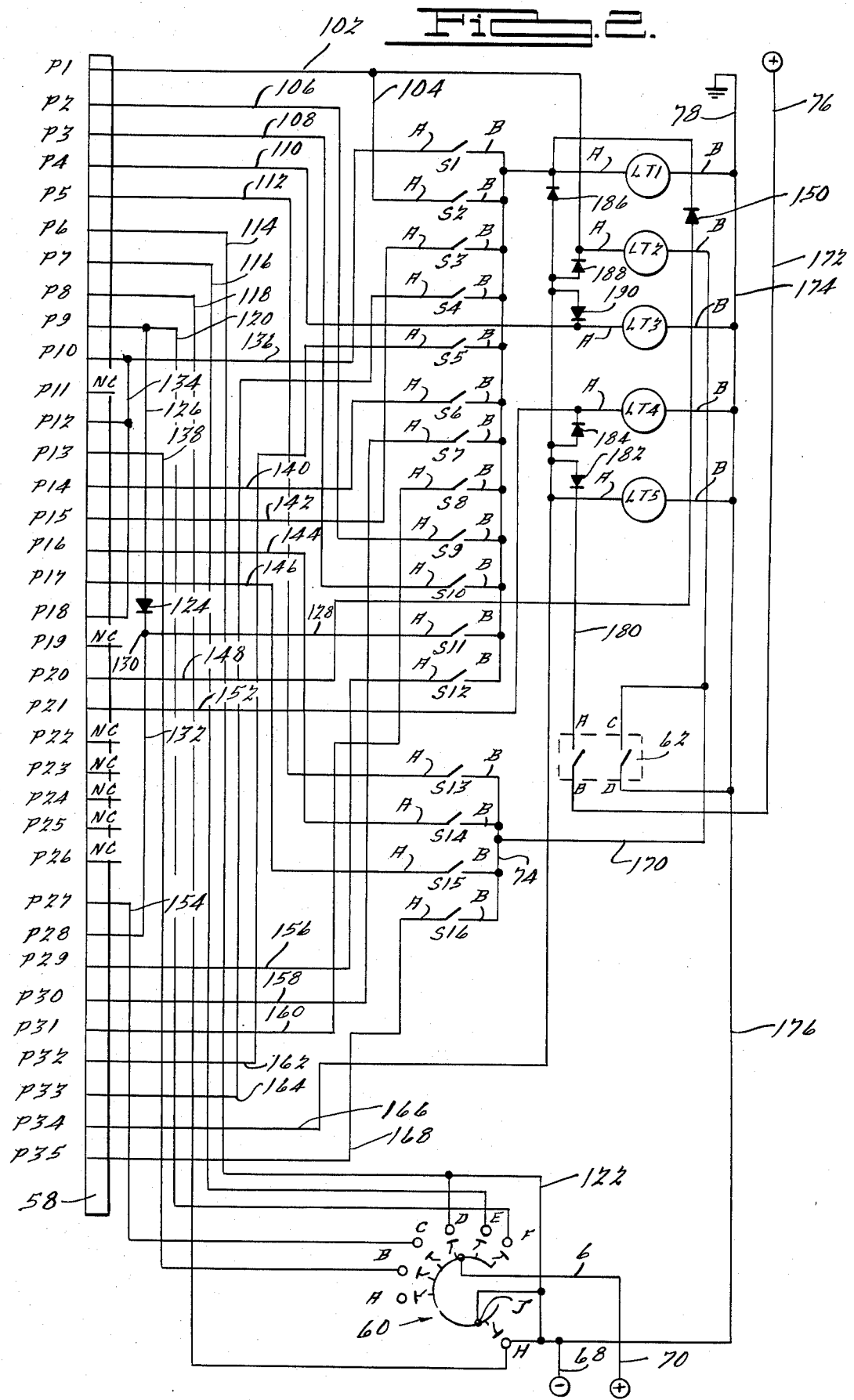
FIG. 2 is a schematic block diagram illustrating the circuit of the present invention.

Referring now to FIG. 2, the electronic circuit of the present invention in its preferred embodiment will now be described. As stated above harness connector 58 is a multiple pin connector, such as an inline multiple pin connector, having a plurality of pins or terminals for coupling to the wiring harness 32 of the fuel injection system of an automotive vehicle. In FIG. 2 the terminals of connector 58 are designated by the reference numerals P1-P35. While the presently preferred embodiment utilizes a 35 pin connector, it will be understood that this is not to be construed as a limitation of the invention or of the scope of the claims as set forth herein. It will be seen that certain of the terminals labeled NC are not used, and thus provide additional input/output capability for future expansion of the tester. Switches S1 through S16 are single pole, single throw switches preferably of the momentary push button type. Each of the switches S1 through S12 have first and second terminals A and B. The B terminals of switches S1 through S12 are coupled to a common bus 72 while the B terminals of switches S13 through S16 are coupled to a common bus 74.

Indicators LT1 through LT5 have first and second terminals A and B for connection to the electrical circuit yet to be described. The circuit further includes a positive supply bus 76 coupled to lead 64 and a negative or ground bus 78 coupled to lead 66, for coupling to a source of DC power. Rotary switch 60 includes a first plurality of terminals A through F which may be selectively coupled to a common terminal G, and a terminal H which may be selectively coupled to terminals J. The analyzer test switch 62 is a double pole single throw switch having terminals A, B, C and D. Switch 62 is constructed to make or break a connection between terminals A and B and between terminals C and D simultaneously upon actuation of the switch.

As stated above terminals 1 through 35 are adapted for coupling to the wiring harness 32 which is normally connected to the control unit 21 of an electronic fuel injection system for a vehicle. Those skilled in the art will recognize that there are numerous configurations possible, and among these configurations the particular pins utilized to interconnect the elements and sensors of the fuel injection system with the control unit may vary from system to system. Accordingly, for purposes of illustrating the invention in a typical environment, pins 1 through 35 are designated for connection to the components and sensors of a typical fuel injection system according to Table 1 below. The particular choice of pins utilized in the example set forth herein are not intended as a limitation of the scope of the invention or the appended claims.

TABLE 1

| | Electronic Fuel Injection Wiring System | |
|---|---|---|
| Pin # | Sensor/Component | How Sensor/Component is Used |
| 1 | Ignition Coil | Monitors engine R.P.M. (when to open injectors). |
| 2 & 3 | Throttle Switch | Monitors throttle position - pin 2 is for idle enrichment: pin 3 for full enrichment. |
| 4 | Start Signals | Monitors ignition start position, when being started. (For starts enrichment). |
| 5 | Ground Circuit | One of the control units ground circuits |

TABLE 1-continued

| Pin # | Sensor/Component | How Sensor/Component is Used |
|---|---|---|
| | | (attached to battery negative). |
| 6–9 | Air Flow Meter | Monitors the amount of air entering the engine, the control units main source of information. |
| 10 | Battery Voltage | Electronic control unit voltage to power its internal circuits - attached to battery positive via ignition switch (on position). |
| 11 | Not Used | Not used on this vehicle but may be used on later models. |
| 12 | Altitude Sensor | Senses the vehicles altitude so fuel can be leaned for thinner air above. |
| 13 | Engine Temp Sensor | Senses the temperature of the engine, cold engine needs a richer mixture. Then must be leaned as engine warms up to operating temp. |
| 14 | Injector #4 | This is to control the injector ground side which closes to injector may open. |
| 15 | Injector #1 | Same as pin #14 |
| 16 | Ground | Same as pin #15 |
| 17 | Ground | Same as pin #15 |
| 18 | Throttle Switch | Electronic control unit sends voltage to throttle switch to supply current to pins numbers 2 and 3. |
| 19 | Not Used | Same as pin #11 |
| 20 | Fuel Pump | Used only for testing that fuel pump and air regulator is receiving current air flow meter contacts are closed. |
| 21 | Cold Start Valve | Used only for testing that cold start valve is receiving current when key is in start position. |
| 22, 23 24, 25, 26 | | Same as pin #11 |
| 27 | Air Temperature Sensor | Monitor the temperature of the incoming air so to richen the mixture when the temperature lowers (air is denser). |
| 28, 29 | Not Used | Same as pin #11 |
| 30 | Injector #5 | Same as pin #14 |
| 31 | Injector #6 | Same as pin #14 |
| 32 | Injector #3 | Same as pin #14 |
| 33 | Injector #2 | Same as pin #14 |
| 34 | Fuel Pump & Air Regulator | Used only for testing that the fuel pump and air regulator are receiving current when ignition key is in the start position. |
| 35 | Ground | Same as pin #5 |

The interconnection of components which make up the electrical circuit portion of the present invention in its presently preferred embodiment will now be described with reference to FIG. 2. Pin P1 is coupled to terminal A of indicator LT2 through lead 102. Pin P1 is also coupled to terminal A of switch S2 through lead 104. Pin P2 is coupled through lead 106 to terminal A of switch S9, while in P3 is coupled through lead 108 to terminal A of switch S10. Pin P4 is coupled through lead 110 to terminal A of indicator LT3. Pin P5, which for purposes of this example may be coupled to one of the ground circuits of the electronic fuel injection system, is coupled through lead 112 to terminal A of switch S12. Pins P6, P7, P8 and P9 are coupled through respective leads 114, 116, 118 and 120 to terminals D, E, H and F of rotary switch 60 respectively. In addition terminals D and J of rotary switch 60 are coupled together through lead 122, thus coupling pin P6 to terminal J as well as terminal D. Diode 124 is coupled between pin P5 and switch S11 through leads 126 and 128, respectively, diode 124 being poled to conduct current in the direction from pin P9 to terminal A of switch S11, and to block current from flowing in the opposite direction. Diode 124 is further coupled at its cathode 130 to pin P28 through lead 132.

Pin P10 is coupled through bus 134 to pins P12 and P18, and further coupled through lead 136 to terminal A of switch S1. In the presently preferred embodiment pins P11, P19, P22, P23, P24, P25 and P26 are not connected. As mentioned above these unused pins are available for future circuit expansion or to accommodate different fuel injection system configurations. Pin P13 is coupled through lead 138 to terminal B of rotary switch 60 and pins P14 and P15 are coupled through respective leads 140 and 142 to terminals A of switches S6 and S3, respectively. Pins P16 and P17, which are coupleable to the system ground of the fuel injection system being tested, are coupled through leads 144 and 146 to terminals A of switches S14 and S15, respectively. (Add pin 19). Pin P20 is coupled through lead 148 and diode 150 to terminals A of indicator LT1. Diode 150 is poled to conduct current in a direction from pin 20 to terminal A of indicator LT1. Pin P21 is coupled through lead 152 to terminal A of indicator LT4. Pin P27 is coupled through lead 154 to terminal C of rotary switch 60 and pin P29 is coupled through lead 156 to terminal A of switch S12. Pin 130 is coupled through lead 158 to terminal A of switch S7, pin P31 is coupled through lead 160 to terminal A of switch S8, and pin P32 is coupled through lead 162 to terminal A of switch S5. Pin 33 is coupled through lead 164 to terminal A of switch S4, pin 34 is coupled through lead 166 to terminal A of the indicator LT5 and pin P35, which in use is coupled to a ground circuit of the fuel injection system, is coupled through lead 168 to terminal A of switch S16.

Bus 74, to which terminals B of switches S13 through S16 are coupled, is in turn coupled through lead 170 to terminal B of indicator LT2. It will thus be seen that switches S13 through S16 may be selectively actuated to test the integrity of the various system ground circuits coupled through pins P5, P16, P17 and P35.

Ohmmeter leads 68 and 70 are coupled to terminals H and G respectively for connection, during use, to a conventional Ohmmeter. Ohmmeter leads 68 and 70 may be provided with connector jacks or alligator clips, or the like, for connection to the ohmmeter test leads. In the alternative ohmmeter leads 68 and 70 may be connected to jacks on the front panel of housing 50, for example, into which the ohmmeter test leads may be engaged.

In order to test the integrity of the invention itself a test circuit is provided. Power supply leads 76 and 78, which will be recognized as forming a supply bus 172 and a return or ground bus 174, are coupled to terminals B and D of test switch 62, respectively. In addition, the return bus or ground bus 174 is coupled through lead 176 to terminal H of rotary switch 60, thus grounding ohmmeter lead 68. When test switch 62 is actuated, closing both poles of the switch, terminal A is coupled to terminal B, and terminal C is coupled to terminal D. Terminal A is coupled through lead 180 and diodes 182 and 184 to the respective terminals A of indicators LT5 and LT4, respectively. Diodes 182 and 184 are poled to conduct current in a direction from switch 62 to the corresponding indicators to which they are connected. In a similar fashion diodes 186, 188 and 190 are coupled between terminal A of switch 62 and the respective terminals A of indicators LT1, LT2 and LT3. In each case diodes 186, 188 and 190 are poled to conduct current in a direction from terminal A of switch 62 to terminal A of the indicator to which each diode is coupled.

Referring now to FIG. 5 the throttle switch tester of the present invention is illustrated. The trottle switch tester, which may be housed in housing 50, comprises harness 200 for coupling to the throttle switch of the automotive vehicle by removing the vehicle harness normally coupled to the throttle switch, and harness 202 for coupling to the vehicle harness. Harness 200 has a first lead 204 coupled to "full" indicator 206, which may be an incandescent light bulb or light emitting diode, for example. A second lead 208 of harness 200 is coupled to a first terminal A of battery 210. A second terminal B of battery 210 is coupled through switch 212 to bus 214. Battery 212 may have a nominal voltage of approximately 9 volts. A third lead 216 of harness 200 is coupled to "idle" indicator 218, which may be an incandescent light bulb or light emitting diode. Indicators 206 and 208 are further coupled in parallel to bus 214. Harness 202 includes a first lead 220 coupled to "full" switch 222, and a second lead 224, coupled to "idle" switch 226. Switches 222 and 226 are in turn coupled in parallel through bus 228. Bus 228 is in turn coupled to a third lead 230 of harness 202.

In operation the invention is coupled to the automotive vehicle as explained herein. The integrity of the tester itself is first checked by attaching power supply leads 64 and 66 to a source of D.C. electrical current, such as the vehicle battery. Lead 64 should be attached to the positive terminal of the battery and lead 66 to the negative terminal. Next, analyzer test switch 62 is actuated to perform the integrity test. If all five indicators LT1 through LT5 are on, the tester is properly operating. If any of the indicators is not on, the tester is not properly functioning. Having completed the tester integrity test, leads 64 and 66 may be removed from the battery terminals, although they may be left connected, and switch 62 returned to its off position or normally open position.

Next, the components of the fuel injection system may be tested as follows. Wiring harness 32 is unhooked from control unit 21 by unplugging connector 33 from connector 34. Connector 33 is then coupled to connector 58 of the tester. This couples pins P1 through P35 to the corresponding leads which make up harness 32, thereby coupling the components and sensors of the electronic control system (excluding the control unit 21) to the tester of the present invention. Next, a template 54, corresponding to the particular vehicle or type of electronic fuel injection system under test, is placed on front panel 52 over the various switches and indicators disposed thereon. Switches S1 through S12 are then actuated and deactuated in succession. Each time one of the switches S1 through S12 is actuated, indicator LT1 should light indicating that the component or sensor associated with the actuated switch is operational. If indicator LT1 fails to light the associated sensor or component is defective.

Next, the ground circuits are tested by depressing switches S13 through S16. Indicator LT2 should light indicating that the particular ground circuit being tested is operational. If indicator LT2 does not light the ground circuit under test is faulty.

The next test is performed by actuating the vehicle ignition switch 24 by turning the vehicle's ignition key to the start position. If desired, the vehicle's ignition lead wire may be removed from the starter solenoid during this test, however, such action is optional. Turning the vehicle ignition switch to the start position should cause indicators LT3, LT4, and LT5 to light indicating that the respective circuits coupled to pins P4, P21, and P34 are operational. With reference to Table I, it will be seen that these circuits correspond to the start signal component (P4), cold start valve (P21) and fuel pump and air regulator (P34) in the example represented by Table I. Similarly, the tests performed by switches S1 through S12 correspond to the circuits, components or sensors attached to the following pins as set forth in Table II below. Likewise, switches S13 through S16 correspond to the circuits, components or sensors attached to the pins as set forth in Table II. It will be understood that template 54 may be provided with labels which relate switches S1 through S16 to the various sensors and components of the fuel injection system. In this regard, it will be seen that Table II provides the information necessary to produce such templates for any electronic fuel injection system utilizing a thirty-five pin connector, and those skilled in the art will readily recognize how to extend the concepts of the present invention to fuel injection systems employing a different number of connector pins.

TABLE II

| Tester Switch - Pin Number Relationship | | | |
|---|---|---|---|
| Switch | Corresponding Pin | Switch | Corresponding Pin |
| S1 | P10 | S9 | P2 |
| S2 | P1 | S10 | P3 |
| S3 | P15 | S11 | P28-P5 |
| S4 | P33 | S12 | P29 |

TABLE II-continued

| Tester Switch - Pin Number Relationship | | | |
|---|---|---|---|
| Switch | Corresponding Pin | Switch | Corresponding Pin |
| S5 | P32 | S13 | P5 |
| S6 | P14 | S14 | P16 |
| S7 | P30 | S15 | P17 |
| S8 | P31 | S16 | P35 |

The next test is performed using the tester in conjunction with a conventional ohm meter which has been set and calibrated in the usual fashion on the R×10 range. The ohm meter's common or ground lead is coupled to lead 68 of the tester while the positive lead of the ohm meter is coupled to lead 70 of the tester. If ground lead 66 is not already connected to the vehicle system ground, it should be so connected at this time. Next, switch 60 is rotated through positions 0 to 5 as shown on the face of template 54. With reference to FIG. 2, it will be seen that switch position O corresponds to terminal A of switch 60; position 1 corresponds to terminal B; 3 to terminal C; 4 to terminal D; and 5 to terminal F. By rotating switch 60 through positions 0–5, the ohm meter consecutively measures the resistance of the water/head temperature sensor, the air temperature sensor, and the various air flow meters according to Table III set forth below. These resistance measurements provide an indication of the integrity of the various sensors under test, and in this regard, Table III sets forth nominal resistance measurements for a typical electronic fuel injection system. Resistance measurements falling outside the typical range would indicate that the integrity of the system under test is suspect. A reading of approximately 0 ohms would indicate that the component or sensor, or its associated circuitry, is short, while an infinite ohm reading would indicate an open circuit.

TABLE III

| Nominal Resistances For Typical System | | |
|---|---|---|
| Switch 60 Setting | Ohm Meter Reading (Ohms) | Device Or Sensor Under Test |
| 0 | infinity | not applicable |
| 1 | 150–4500 | water/head temperature sensor |
| 2 | 700–4500 | air temperature sensor |
| 3–5 | 100–200 (may vary) | air flow meters #1, #2, #3 |

In order to test the throttle switch and to set the carbon monoxide levels in the exhaust on full enrichment, the throttle tester shown in FIG. 5 is employed. The throttle tester is interconnected between the vehicle throttle switch and the vehicle harness normally connected to the throttle switch. This is done by disconnecting the vehicle harness from the throttle switch, coupling harness 200 to the throttle switch and coupling harness 202 to the vehicle harness. The throttle switch may then be toggled between "full" and "idle" positions. If the throttle switch is operative, indicators 206 and 218 will alternately light when the throttle switch is toggled. Switches 222 and 226 may be alternately actuated to place the vehicle in its respective full throttle and idle throttle conditions simulating the action of the vehicle throttle switch. This enables the mechanic to determine, using an exhaust emission analyzer, for example, whether the fuel injection system is providing the proper full mixture and idle mixture in response to signals from the throttle switch.

While it will be apparent that the preferred embodiments of the invention disclosed are well calculated to fulfill the objects above stated, it will be appreciated that the invention is susceptible to modification, variation and change without departing from the proper scope or fair meaning of the invention.

What is claimed is:

1. A method of testing the integrity of an electronically controlled vehicle fuel injection system of the type having a plurality of electrically responsive elements and at least one grounding circuit coupled through a wiring system having first and second ends to a central control unit comprising the steps of electrically coupling one end of said wiring system to a tester comprising connector means having a plurality of terminals for coupling to said wiring systems, first switching means coupled to one of said terminals, second switching means coupled to another of said terminals, indicator means coupled to said first and second switching means for producing a signal indicative of the integrity of said elements;

actuating said first switching means to electrically couple a first of said elements to said indicator means thereby enabling said indicator means to produce a signal indicative of the integrity of said first element;

actuating said second switching means to electrically couple said grounding circuit to said indicator means thereby enabling said indicator means to produce a signal indicative of the integrity of said grounding circuit.

2. The method of claim 1 further comprising placing a template means displaying information relative to said fuel injection system on said tester and referencing said signal indicative of the integrity of said elements to said information.

3. The method of claim 1 wherein said tester includes third switching means coupled to a plurality of said terminals and a ground buss means, comprising the additional steps of coupling a first terminal of a resistance measuring means to said ground buss means, coupling a second terminal of a resistance measuring means to said third switching means, actuating said third switching means to selectively couple each of said plurality of terminals to said resistance measuring means.

4. The method of claim 1 wherein said tester includes test switch means coupled to said indicator means comprising the additional step of testing said indicator means by coupling said test switch means to a source of electrical energy, actuating said test switch means.

5. The method of claim 1 wherein said vehicle includes an ignition switch and said method includes the step of activating said ignition switch to electrically couple a second of said elements to said indicator means, thereby enabling said indicator means to produce a signal indicative of the integrity of said second element.

6. A tester for in circuit testing of an electronically controlled vehicle fuel injection systems of the type having a plurality of electrically responsive components coupled through a wiring system to a central control unit and having at least one grounding system, and wherein at least one of said electrically responsive components is receptive of electrical power from said vehicle, said tester comprising:

connector means having a plurality of electrical terminals adapted for coupling to said wiring system;

first, second and third busses for conducting electrical energy;

first and second electrically operable indicator means each having an A terminal and a B terminal, said first indicator means having its A terminal coupled to said first buss and having its B terminal coupled to said second buss, said second indicator means having its A terminal coupled to said connector means for receiving an electrical potential from one of said electrically responsive components, and having its B terminal coupled to said third buss;

first switching means coupled to a selected first plurality of said electrical terminals and also coupled to said first buss for selectively coupling selected ones of said electrical terminals to said first indicator means; and second switching means coupled to a selected second plurality of said electrical terminals and also coupled to said third buss for selectively coupling selected ones of said electrical terminals to said second indicator means;

wherein actuation of said first switching means couples said A terminal of said first indicator means to said source of electrical potential to thereby test the integrity of a selected electrical component and wherein actuation of said second switching means applies a ground potential to said B terminal of said second indicator means, thereby testing the integrity of a selected grounding circuit of said vehicle.

7. The apparatus of claim 6 wherein said first switching means comprises a group of individual switching means coupled to said first indicator means and to said connector means for testing the integrity of a plurality of individual electrically responsive components.

8. The apparatus of claim 7 wherein each of said group of switching means corresponds to a different electrically responsive component being tests.

9. The apparatus according to claim 6 wherein said first and second switching means each comprise a plurality of manually operable switches.

10. The apparatus according to claim 9 wherein said manually actuable switches comprise push button switches.

11. The apparatus according to claim 9 further comprising common enclosure means having a front panel wherein said switches and said indicator means are disposed on said front panel and further comprising removable template means for labeling the function of said switches and indicator means.

* * * * *

UNITED STATES PATENT AND TRADEMARK OFFICE
CERTIFICATE OF CORRECTION

PATENT NO. : 4,542,335
DATED : September 17, 1985
INVENTOR(S) : Richard L. Williams It is certified that error appears in the above-identified patent and that said Letters Patent is hereby corrected as shown below:

Column 2, line 3; "multiplity" should be --multiplicity--

Column 3, line 18; "closed" should be --closes--

Column 5, line 19; delete "to" and insert --so--

Column 6, line 62 "130" should be --P30--

Column 10, line 14-15; "systems" should be --system--

Column 12, line 12; "tests" should be --tested--

Signed and Sealed this

Twenty-second Day of April 1986

[SEAL]

Attest:

DONALD J. QUIGG

*Attesting Officer*    *Commissioner of Patents and Trademarks*